United States Patent
Lin

(10) Patent No.: US 9,557,213 B2
(45) Date of Patent: Jan. 31, 2017

(54) PHOTOELECTRIC CONVERTOR

(71) Applicant: HON HAI PRECISION INDUSTRY CO., LTD., New Taipei (TW)

(72) Inventor: I-Thun Lin, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 301 days.

(21) Appl. No.: 14/449,386

(22) Filed: Aug. 1, 2014

(65) Prior Publication Data

US 2015/0034805 A1 Feb. 5, 2015

(30) Foreign Application Priority Data

Aug. 2, 2013 (TW) ............................. 102127903 A

(51) Int. Cl.
| | | |
|---|---|---|
| G01J 1/04 | (2006.01) | |
| H01L 31/0232 | (2014.01) | |
| H01L 31/173 | (2006.01) | |

(52) U.S. Cl.
CPC ............ G01J 1/0411 (2013.01); G01J 1/0403 (2013.01); G01J 1/0407 (2013.01); H01L 31/0232 (2013.01); H01L 31/173 (2013.01)

(58) Field of Classification Search
CPC ...... G01J 1/0411; G01J 1/0407; G01J 1/0403; G01J 1/0425; G01J 1/04; H01L 31/173; H01L 31/0232; H01L 31/02327; H01L 31/167; H01L 31/14; H01L 31/12
USPC ...................................................... 385/88–94
See application file for complete search history.

(56) References Cited

U.S. PATENT DOCUMENTS

| | | | | |
|---|---|---|---|---|
| 9,035,234 B2* | 5/2015 | Wu | ......................... | H01L 31/12 |
| | | | | 250/239 |
| 9,074,928 B2* | 7/2015 | Lin | ....................... | G01J 1/0271 |
| 9,157,792 B2* | 10/2015 | Hung | .................... | G01J 1/0407 |
| 9,207,114 B2* | 12/2015 | Hung | .................... | G01J 1/0411 |
| 2003/0142929 A1* | 7/2003 | Bartur | .................. | G02B 6/4214 |
| | | | | 385/92 |
| 2003/0219217 A1* | 11/2003 | Wickman | .............. | G02B 6/4249 |
| | | | | 385/89 |
| 2004/0028350 A1* | 2/2004 | Gerdom | ............... | G02B 6/4204 |
| | | | | 385/88 |
| 2004/0114866 A1* | 6/2004 | Hiramatsu | ........... | G02B 6/4292 |
| | | | | 385/39 |
| 2004/0234210 A1* | 11/2004 | Nagasaka | ............ | G02B 6/4214 |
| | | | | 385/88 |
| 2005/0111798 A1* | 5/2005 | Doiron | ................... | H05K 5/069 |
| | | | | 385/94 |
| 2005/0117853 A1* | 6/2005 | Murali | ................. | G02B 6/4214 |
| | | | | 385/88 |
| 2005/0175297 A1* | 8/2005 | Mazotti | ................ | G02B 6/4201 |
| | | | | 385/92 |
| 2006/0024004 A1* | 2/2006 | Pfnuer | ................. | G02B 6/4201 |
| | | | | 385/92 |

(Continued)

*Primary Examiner* — John Lee
(74) *Attorney, Agent, or Firm* — Zhigang Ma

(57) ABSTRACT

An photoelectric convertor comprises an optical coupler, a circuit board and two restricting posts fixed on the circuit board. The optical coupler defined two restricting grooves passing through its bottom surface and top surface. When the optical coupler is positioned on the circuit board, the two restricting posts are respectively engaged in the two restricting grooves. Each restricting groove has a sidewall opposite to a front surface of the optical coupler.

5 Claims, 7 Drawing Sheets

(56) References Cited

U.S. PATENT DOCUMENTS

| | | | |
|---|---|---|---|
| 2006/0110110 A1* | 5/2006 | Yi | G02B 6/421 385/93 |
| 2006/0159405 A1* | 7/2006 | Yajima | G02B 6/4206 385/88 |
| 2007/0183724 A1* | 8/2007 | Sato | G02B 6/4292 385/89 |
| 2009/0123118 A1* | 5/2009 | Teo | G02B 6/4201 385/93 |
| 2010/0129035 A1* | 5/2010 | Teo | G02B 6/4201 385/88 |
| 2011/0274395 A1* | 11/2011 | Edris | G02B 6/3518 385/89 |
| 2012/0076461 A1* | 3/2012 | Hsieh | H05K 1/184 385/89 |
| 2013/0330044 A1* | 12/2013 | Wu | G02B 6/4214 385/76 |
| 2014/0084190 A1* | 3/2014 | Lin | G01J 1/0271 250/578.1 |
| 2014/0110570 A1* | 4/2014 | Morioka | G02B 6/4286 250/216 |
| 2014/0145064 A1* | 5/2014 | Hung | G01J 1/0411 250/206 |
| 2014/0147084 A1* | 5/2014 | Yabre | G02B 6/30 385/88 |
| 2014/0151536 A1* | 6/2014 | Wu | H01L 31/12 250/216 |
| 2014/0151585 A1* | 6/2014 | Hung | G01J 1/0411 250/578.1 |
| 2014/0153881 A1* | 6/2014 | Liff | G02B 6/4214 385/89 |
| 2014/0178001 A1* | 6/2014 | Hung | G02B 6/4214 385/33 |
| 2014/0294354 A1* | 10/2014 | Hung | G02B 6/4204 385/93 |
| 2015/0030286 A1* | 1/2015 | Lin | G02B 6/428 385/33 |
| 2015/0034805 A1* | 2/2015 | Lin | G01J 1/0411 250/208.2 |
| 2015/0049986 A1* | 2/2015 | Kuo | G02B 6/4292 385/33 |
| 2015/0362685 A1* | 12/2015 | Shah | G02B 6/4246 385/89 |

\* cited by examiner

PHOTOELECTRIC CONVERTOR

FIELD

The present disclosure relates to a photoelectric convertor.

BACKGROUND

A photoelectric convertor usually includes a circuit board and an optical coupler positioned on the circuit board. The optical coupler is usually fixed on the circuit board through a heat-curable adhesive.

BRIEF DESCRIPTION OF THE DRAWINGS

The components of the drawings are not necessarily drawn to scale, the emphasis instead being placed upon clearly illustrating the principles of the embodiments of the present disclosure. Moreover, in the drawings, like reference numerals designate corresponding parts throughout several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one." The references "a number of" mean "at least two." The references "outside" refer to a region that is beyond the outermost confines of a physical object. The references "substantially" are defined to be essentially conforming to the particular dimension, shape or other word that substantially modifies, such that the component need not be exact. The references "comprising," when utilized, mean "including, but not necessarily limited to"; it specifically indicates open-ended inclusion or membership in the so-described combination, group, series and the like.

Figure 1:
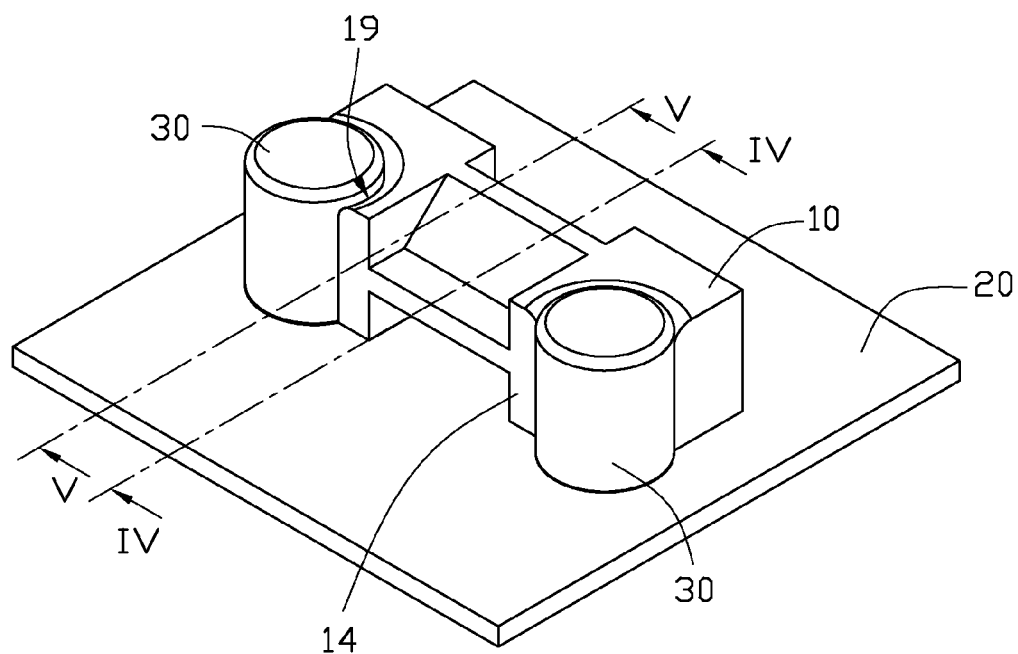
FIG. 1 is an isometric view of a first embodiment of a photoelectric convertor.
Figure 2:
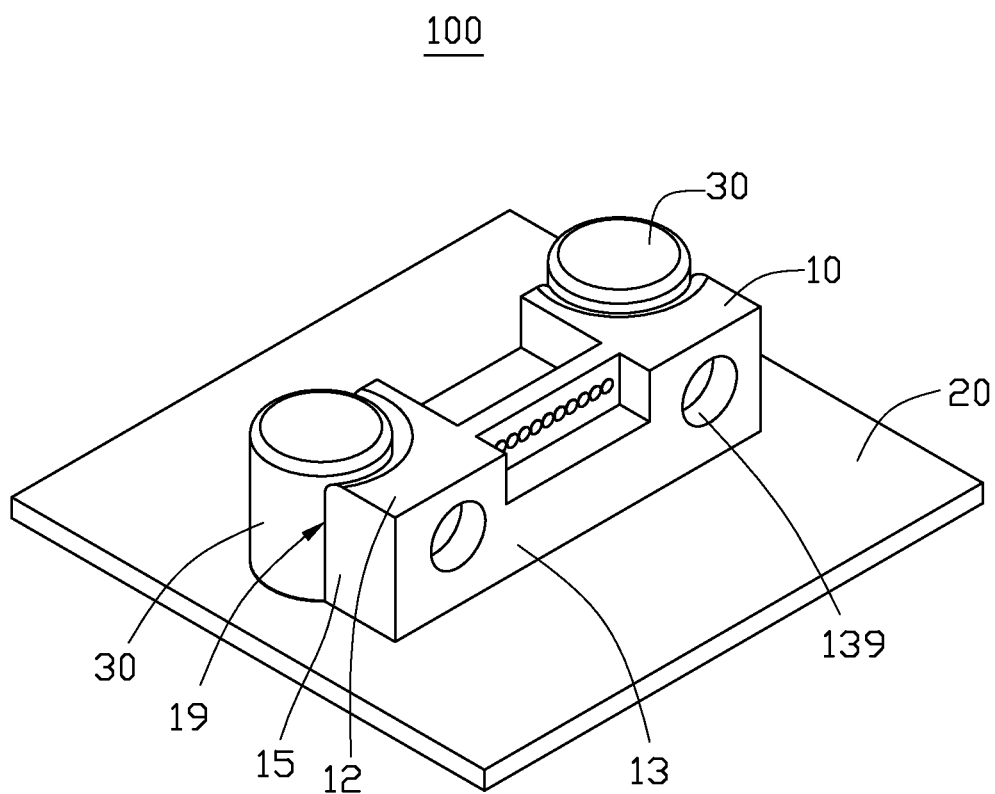
FIG. 2 is another isometric view of the photoelectric convertor of FIG. 1.
Figure 3:
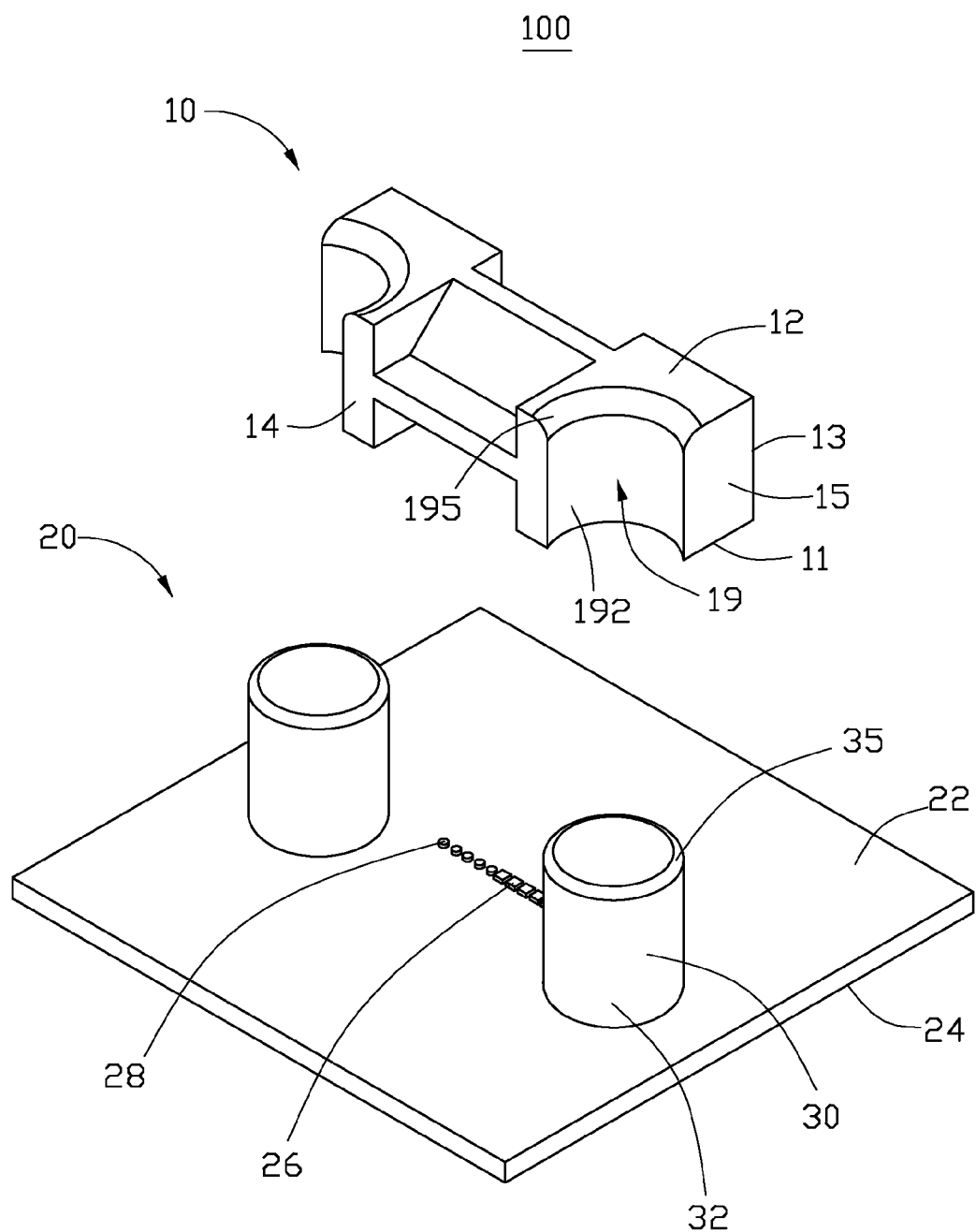
FIG. 3 is an exploded, isometric view of the photoelectric convertor of FIG. 1.

FIGS. 1-3 illustrate a first embodiment of a photoelectric convertor 100. The photoelectric convertor 100 includes an optical coupler 10, a circuit board 20, two restricting posts 30, a number of light emitters 26, and a number of light receivers 28. In at least one embodiment, the photoelectric convertor 100 further comprises a number of first convergent lenses 114 and a number of second convergent lenses 134.

The optical coupler 10 includes a bottom surface 11, a top surface 12, a front surface 13, a back surface 14, two side surfaces 15, and two restricting grooves 19. The bottom surface 11 and the top surface 12 are positioned on opposite sides of the optical coupler 10. The top surface 12 is substantially parallel to the bottom surface 11. The front surface 13 and the back surface 14 are positioned on opposite sides of the optical coupler 10. The front surface 13 is substantially parallel to the back surface 14. The two side surfaces 15 are positioned on opposite sides of the optical coupler 10, and the two side surfaces 15 are substantially parallel to each other. The front surface 13, the back surface 14 and the two side surfaces 15 are perpendicularly connected to the bottom surface 11 and the top surface 12. The two side surfaces 15 are perpendicular to the front surface 13 and the back surface 14.

Figure 4:
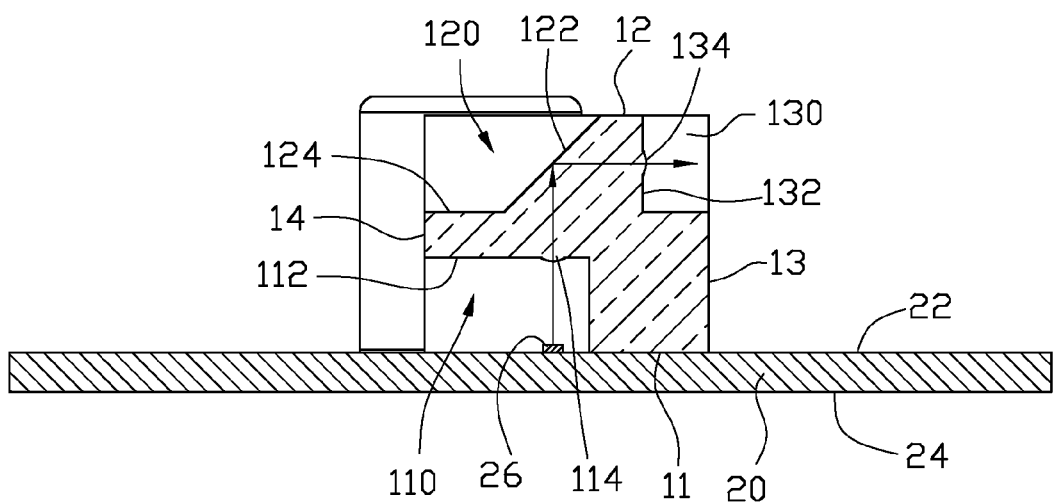
FIG. 4 is a cross sectional view of the photoelectric convertor of FIG. 1, taken along line IV-IV.
Figure 5:
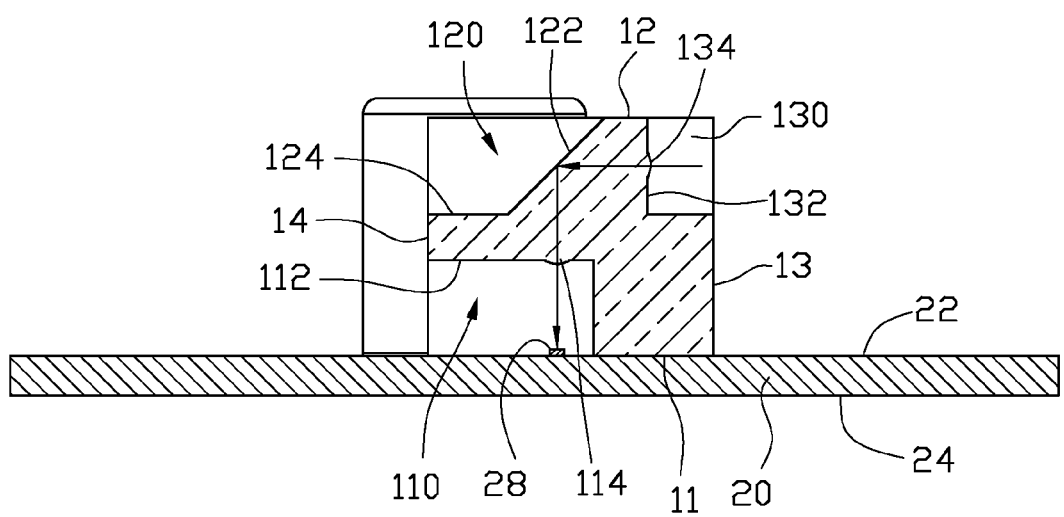
FIG. 5 is a cross sectional view of the photoelectric convertor of FIG. 1, taken along line V-V.

FIG. 4-5 illustrate the photoelectric convertor 100 in cross sectional view. The optical coupler 10 defines a bottom groove 110 in the bottom surface 11. The bottom groove 110 has a first optical surface 112 positioned on a bottom portion of the bottom groove 110. The first optical surface 112 is substantially parallel to the bottom surface 11. In at least on embodiment, the bottom groove 110 passes through the back surface 14, and the first optical surface 112 is connected to the back surface 14. The first convergent lenses 114 are positioned on the first optical surface 112. In at least one embodiment, the first convergent lenses 114 are arranged along a linear direction substantially parallel to the front surface 13.

The optical coupler 10 defines a top groove 120 in the top surface 12. The top groove 120 has a reflecting surface 122 and a connecting surface 124. The reflecting surface 122 is inclined for substantially 45 degrees relative to the first optical surface 112. The reflecting surface 122 is also inclined for substantially 45 degrees relative to the front surface 13. The connecting surface 124 is substantially parallel to the top surface 12. In at least one embodiment, the top groove 120 passes through the back surface 14, and the connecting surface 124 is connected between the reflecting surface 122 and the back surface 14.

The optical coupler 10 defines a front groove 130 in the front surface 13. The front groove 130 is recessed toward the back surface 14. The front groove 130 has second optical surface 132 positioned on a bottom portion of the front groove 130. The second optical surface 132 is substantially parallel to the front surface 13. In at least one embodiment, the front groove 130 passes through the top surface 12, and the second optical surface 132 is connected to the top surface 12. The second convergent lenses 134 are positioned on the second optical surface 132. The second convergent lenses 134 each spatially correspond to one of the first convergent lenses 114. In at least one embodiment, the second convergent lenses 134 are arranged along a linear direction parallel to the reflecting surface 122. The optical coupler 10 further defines two installing holes 139 in the front surface 13. The two installing holes 139 are positioned on opposite sides of the front groove 130. The installing holes 139 are configured to engage with installing posts of an optical fiber receiver (not shown). In other embodiments, the optical coupler 10 can further include two installing posts (not shown), instead of the two installing holes 139, formed on the front surface 13.

The optical coupler 10 defines two restricting grooves 19 passing through the bottom surface 11 and the top surface 12. The two restricting grooves 19 are symmetrically positioned in the optical coupler 10 about a central axis of the optical coupler 10. Each restricting grooves 19 has a sidewall 192. Each sidewall 192 is connected to one of the side surfaces 15 and the back surface 14. Each sidewall 192 is perpendicular to the bottom surface 11 and the top surface 12. The sidewalls 192 are opposite to the front surface 13. Each sidewall 192 is arc shaped. In at least one embodiment, each sidewall 192 is a quarter of a cylindrical surface. Each restricting groove 19 further has a chamfering 195 formed between the top surface 12 and the sidewall 192.

The circuit board 20 includes a upper surface 22 and a lower surface 24 opposite to the upper surface 22. The upper surface 22 and the lower surface 24 are substantially parallel to each other.

The two restricting posts 30 are fixed on the upper surface 22. Each restricting post 30 is cylindrical in shape, and each restricting post 30 includes an outer surface 32. The restricting post 30 can engage with the restricting groove 19 when the optical coupler 10 is positioned on the circuit board 20. The outer surface 32 matches with the sidewall 192. The bottom surface 11 of the optical coupler 10 is adhered to the circuit board 20 through an adhesive (not shown). In at least one embodiment, the adhesive is heat-curable adhesive. Each restricting post 30 defines a chamfering 35 at an end which is far away from the upper surface 22. When the restricting posts 30 are engaged with the restricting grooves 19, the chamfering 35 and the chamfering 195 can cooperatively form a space through which adhesive can be filled between the restricting post 30 and the sidewall 192. In this way, the optical coupler 10 can be tightly fixed on the circuit board 20, although the restricting posts 30 are exposed to outside.

The light emitters 26 and the light receivers 28 are positioned on the upper surface 22. The light emitters 26 and the light receivers 28 are received in the bottom groove 110. The light emitters 26 and the light receivers 28 each are aligned with one of the first convergent lenses 114. The light emitters 26 are configured to emit light beams toward the first convergent lenses 114. The light receivers 28 are configured to receive light beams coming from the first convergent lenses 114. In at least one embodiment, the light emitters 26 and the light receivers 28 are arranged on a linear direction parallel to the front surface 13.

In work, referring to FIG. 4, the light emitter 26 emits a light beam toward the first optical surface 112, the first convergent lenses 114 converges the light beam to the reflecting surface 122. The reflecting surface 122 then totally reflects the light beam to the second optical surface 132. The light beam then is emergent out through the second convergent lenses 134. Referring to FIG. 5, a light beam is incident into the optical coupler 10 through the second optical surface 132. The second convergent lenses 134 converges the light beam to the reflecting surface 122. The reflecting surface 122 then totally reflects the light beam to the first optical surface 112. The first convergent lenses 114 converges the light beam out to the light receivers 28.

Figure 6:
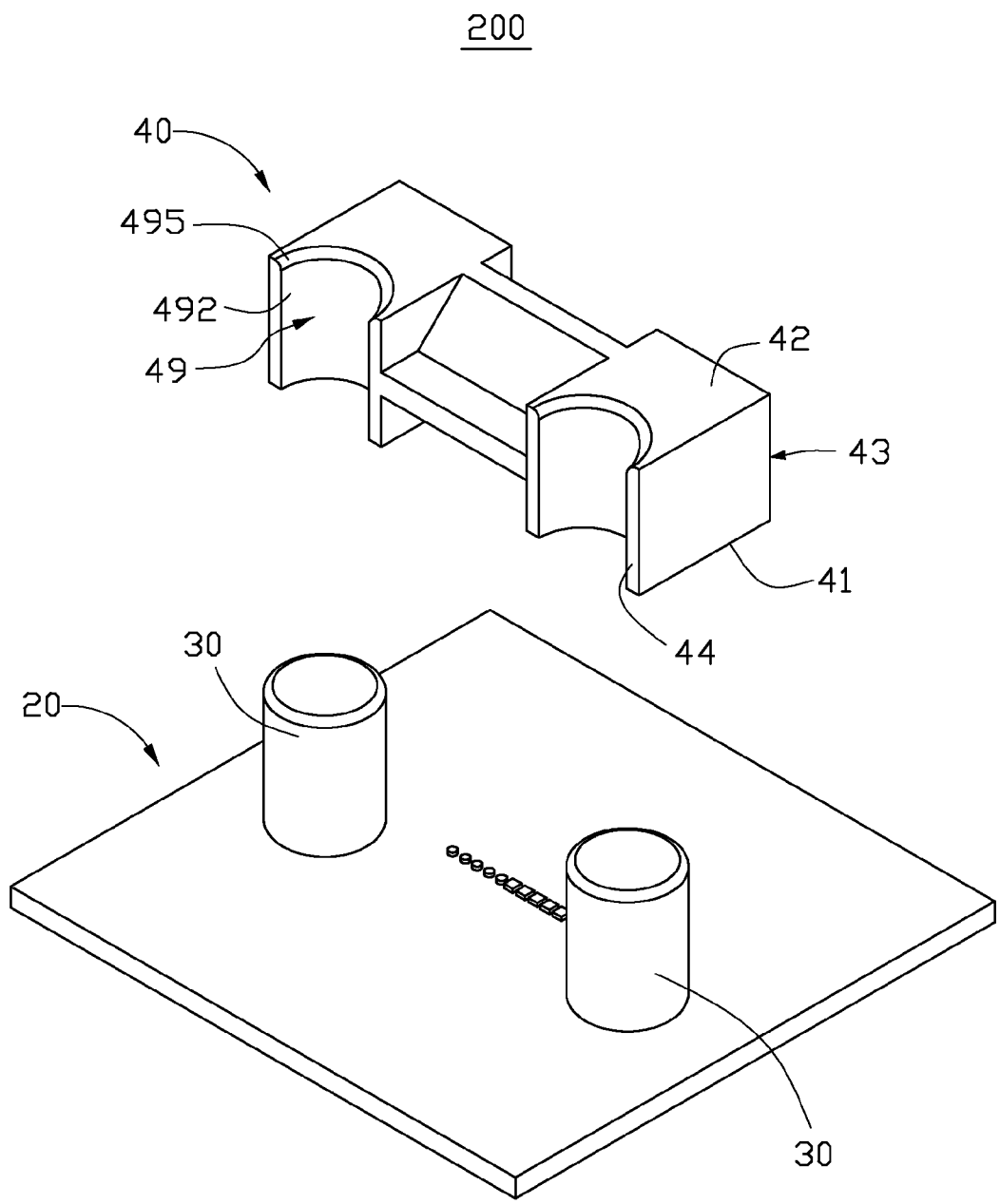
FIG. 6 is an exploded, isometric view of a second embodiment of a photoelectric convertor.

FIG. 6 illustrates a second embodiment of a photoelectric convertor 200. The photoelectric convertor 200 is substantially the same as the photoelectric convertor 100, except that the photoelectric convertor 200 includes an optical coupler 40 instead of the optical coupler 10.

The optical coupler 40 includes a bottom surface 41, a top surface 42 opposite to the bottom surface 41, a front surface 43, and a back surface 44 opposite to the front surface 43. The back surface 44 is perpendicularly connected between the bottom surface 41 and the top surface 42. The optical coupler 40 defines two restricting grooves 49 in the back surface 44. Each restricting groove 49 passes through the bottom surface 41 and the top surface 42. Each restricting groove 49 has a sidewall 492 perpendicular to the bottom surface 41 and the top surface 42. Each sidewall 492 is connected to the back surface 44. The sidewalls 492 are opposite to the front surface 43. The sidewalls 492 are arc shaped. Each sidewall 492 is semi-cylindrical. In at least one embodiment, each restricting groove 49 further has a chamfering 495 formed between the top surface 42 and the sidewall 492.

Figure 7:
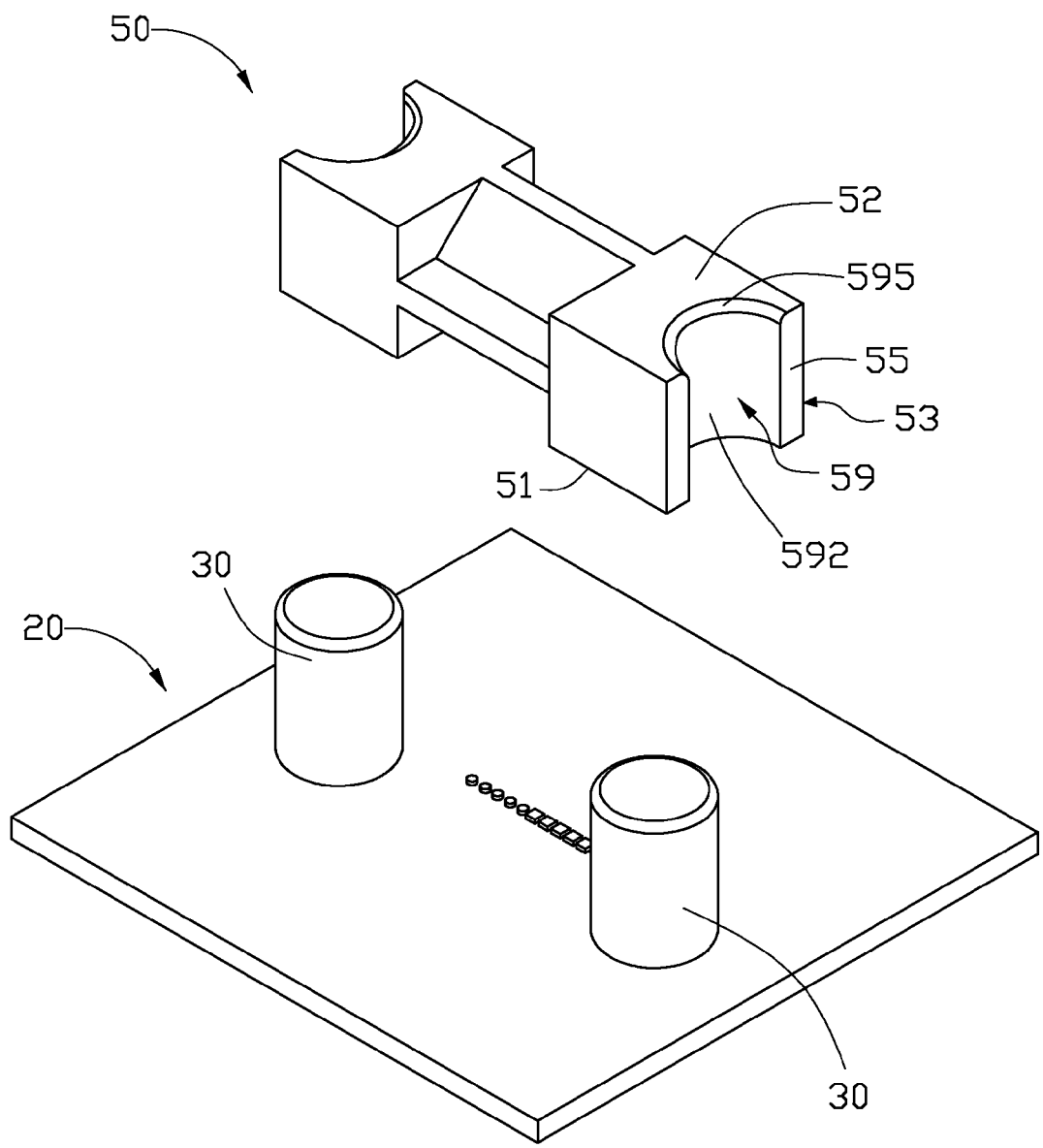
FIG. 7 is an exploded, isometric view of a third embodiment of a photoelectric convertor.

FIG. 7 illustrates a third embodiment of a photoelectric convertor 300. The photoelectric convertor 300 is substantially the same as the photoelectric convertor 100, except that the photoelectric convertor 300 includes an optical coupler 50 instead of the optical coupler 10.

The optical coupler 50 includes a bottom surface 51, a top surface 52 opposite to the bottom surface 51, a front surface 53, and two side surfaces 55 opposite to each other. The front surface 53 is perpendicularly connected between the two side surfaces 55. Each side surface 55 is perpendicularly connected between the bottom surface 51 and the top surface 52. The optical coupler 50 defines a restricting groove 59 in each of the two side surfaces 55. Each restricting groove 59 passes through the bottom surface 51 and the top surface 52. Each restricting groove 59 has a sidewall 592 perpendicular to the bottom surface 51 and the top surface 52. Each sidewall 592 is connected to the side surface 55. The sidewalls 592 are opposite to the front surface 53. The sidewalls 592 are arc shaped. Each sidewall 592 is connected to the side surface 55. Each sidewall 592 is semi-cylindrical. In at least one embodiment, each restricting groove 59 further has a chamfering 595 formed between the top surface 52 and the sidewall 592.

The above-described photoelectric convertor includes an optical coupler, a circuit board, and two restricting posts fixed on the circuit board. The optical coupler defines two restricting grooves corresponding to the two restricting posts. Each restricting groove has a sidewall opposite to a front surface in which two installing holes are defined. When an optical fiber receiver is assembled with the optical coupler through the two installing holes, the optical coupler will not move relative to the circuit board.

Although numerous characteristics and advantages of the present embodiments have been set forth in the foregoing description, together with details of the structures and functions of the embodiment, the disclosure is illustrative only, and changes may be made in detail, including in the matters of shape, size, and the arrangement of parts within the principles of the disclosure to the full extent indicated by the broad general meaning of the terms in which the appended claims are expressed.

What is claimed is:

1. A photoelectric convertor comprising:
an optical coupler comprising a front surface, a back surface, a bottom surface and a top surface, and two side surfaces opposite to each other, wherein the front surface, the back surface, and the two side surfaces are perpendicularly connected to the top surface and the bottom surface, and the optical coupler defining two restricting grooves, wherein each of the two restricting grooves form a recessed surface positioned between the back surface and one of the two side surfaces, and each of the two restricting grooves pass through the top surface and the bottom surface to form a sidewall;
a circuit board, the optical coupler being positioned on the circuit board;
two restricting posts corresponding to the restricting grooves, the restricting posts being fixed on the circuit board and respectively engaging with the restricting grooves;
wherein the bottom surface of the optical coupler is adhered to the circuit board;

wherein the optical coupler comprises a chamfering formed between the top surface and the sidewall; and the restricting posts are further adhered to the sidewall.

2. The photoelectric convertor of claim 1, the two restricting posts are substantially cylindrical in shape, and each sidewall is a quarter of a cylindrical surface.

3. The photoelectric convertor of claim 1, the two restricting posts are substantially cylindrical in shape, and each sidewall is semi-cylindrical.

4. The photoelectric convertor of claim 1 wherein each of the two restricting grooves is defined in one of the two side surfaces, and each sidewall is connected to one of the two side surfaces.

5. The photoelectric convertor of claim 4, the two restricting posts are substantially cylindrical in shape, and each sidewall is semi-cylindrical.

\* \* \* \* \*